United States Patent
Yamamoto et al.

(10) Patent No.: US 7,753,251 B2
(45) Date of Patent: Jul. 13, 2010

(54) MICRO COMPONENT REMOVING APPARATUS

(75) Inventors: Keiichi Yamamoto, Kawasaki (JP); Masakazu Takesue, Kawasaki (JP); Masanao Fujii, Kawasaki (JP); Toru Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 184 days.

(21) Appl. No.: 11/966,410

(22) Filed: Dec. 28, 2007

(65) Prior Publication Data

US 2008/0099536 A1 May 1, 2008

Related U.S. Application Data

(63) Continuation of application No. PCT/JP2005/012071, filed on Jun. 30, 2005.

(51) Int. Cl.
*B23K 37/00* (2006.01)

(52) U.S. Cl. .................. 228/13; 228/191; 228/264; 219/220

(58) Field of Classification Search ........... None
See application file for complete search history.

(56) References Cited

U.S. PATENT DOCUMENTS

| | | | |
|---|---|---|---|
| 4,934,582 A | | 6/1990 | Bertram et al. |
| 5,072,874 A | * | 12/1991 | Bertram et al. ............ 228/264 |
| 5,139,193 A | * | 8/1992 | Todd ............... 228/180.21 |
| 5,164,037 A | * | 11/1992 | Iwami et al. ............... 156/584 |
| 5,338,381 A | * | 8/1994 | Hidese ...................... 156/64 |
| 5,441,194 A | * | 8/1995 | Nishimura et al. ......... 228/6.2 |
| 5,768,765 A | * | 6/1998 | Fujioka et al. .............. 29/740 |
| 5,826,779 A | * | 10/1998 | Jacks et al. .................. 228/42 |
| 5,909,838 A | * | 6/1999 | Jimarez et al. ............. 228/125 |
| 6,170,736 B1 | * | 1/2001 | Briehl et al. ................ 228/212 |

(Continued)

FOREIGN PATENT DOCUMENTS

JP 5-291738 A 11/1993

(Continued)

OTHER PUBLICATIONS

International Preliminary Report on Patentability for Application No. PCT/JP2005-012071 mailed on Jan. 17, 2008 and English translation.

(Continued)

*Primary Examiner*—Kiley Stoner
(74) *Attorney, Agent, or Firm*—Westerman, Hattori, Daniels & Adrian, LLP

(57) ABSTRACT

A method and a apparatus for removing a micro component surely and leveling solder remaining on a substrate without imposing thermal damage to solder lands, the substrate and components on the periphery. A thermosetting adhesive (15) is provided on the surface (12*a*) of a micro component (12) opposite to the side of a substrate (11), and the distal end of a component holding pin (13) having cross-section area falling within the surface (12*a*) of the micro component (12) opposite to the side of the surface (11) is passed through the thermosetting adhesive (15) to abut against the surface (12*a*) of the micro component (12). Subsequently, solder (16) between the micro component (12) and the substrate (11) is heated to melt and the component holding pin (13) is moved in the direction receding from the substrate (11). Consequently, the micro component (12) is removed from the substrate (11).

4 Claims, 4 Drawing Sheets

U.S. PATENT DOCUMENTS

| | | | |
|---|---|---|---|
| 6,550,669 B1* | 4/2003 | Walz et al. | 228/264 |
| 6,685,080 B1* | 2/2004 | Kee et al. | 228/103 |
| 2003/0030293 A1* | 2/2003 | Kashiwazaki et al. | 294/64.1 |
| 2003/0071109 A1* | 4/2003 | Arikado | 228/180.1 |
| 2004/0206805 A1* | 10/2004 | Kimura et al. | 228/264 |
| 2006/0037997 A1* | 2/2006 | Higashi et al. | 228/234.1 |

FOREIGN PATENT DOCUMENTS

| | | |
|---|---|---|
| JP | 9-64530 A | 3/1997 |
| JP | 10-270840 A | 10/1998 |
| JP | 2001-7508 A | 1/2001 |
| JP | 2004-260053 A | 9/2004 |
| JP | 2005-5460 A | 1/2005 |

OTHER PUBLICATIONS

Chinese Office Action dated Apr. 3, 2009, issued in corresponding Chinese Patent Application No. 200580050916.

International Search Report of PCT/JP2005/012071, date of mailing Aug. 2, 2005.

* cited by examiner

MICRO COMPONENT REMOVING APPARATUS

CROSS-REFERENCE TO RELATED APPLICATION

This is a continuation of Application PCT/JP2005/012071, filed on Jun. 30, 2005, now pending, the contents of which are herein wholly incorporated by reference.

BACKGROUND OD THE INVENTION

1. Technical Field

A method of and a device for removing a micro component such as a chip component that is equal to or smaller than approximately 1 mm on one side are illustrated.

2. Background Art

A conventional method of removing a component based on reworking an angular chip component mounted on a substrate is that an operator melts a solder between the angular chip component and the substrate by use of a tapered soldering iron, a tweezers-like soldering iron and thereafter removes the angular chip component while picking up the component.

According to the conventional method of manually removing the angular chip component, the manual operation can not be conducted so precisely. It was therefore difficult to remove, for example, the micro component such as an angular chip that is equal to or smaller than 1 mm on one side.

Moreover, the heating of the micro component with the soldering iron entails keeping the soldering iron separate from other components. For attaining this, a tip of the solder iron needs tapering on the order of 1 mm or smaller in diameter. When the tip of the soldering iron is tapered, however, a thermal capacity decreases.

On the other hand, lead-free soldering has been recently accelerated, and a solder melting temperature rises. Thus, the solder exhibiting the high melting temperature due to the lead-free tendency, as described above, it is difficult to sufficiently melt the solder by employing the soldering iron of which the tip is equal to or smaller than 1 mm in diameter and of which the thermal capacity is small.

Such a problem of a decline of the operability therefore arises. Moreover, it happens that the component is raised before the solder gets melted sufficiently. In this case, problems are caused, wherein a solder land is damaged, and a thermal stress is applied to the substrate due to an excess over a predetermined period of heating time.

Such being the case, a dedicated rework apparatus is proposed in order to solve these problems. In the rework apparatus, an upper face of the should-be-removed component is sucked by a vacuum nozzle. In this state, the solder between the component and the substrate is heated with warm air and thus melted. Thereafter, the vacuum nozzle is moved upward. The component is thereby removed from the substrate.

The conventional rework apparatus, however, employs the vacuum nozzle, and hence, if the component is mounted with a skew on the substrate, a problem is that the component can not be adsorbed by the vacuum nozzle. In this case, the micro component can not be removed.

A solution for this type of problem is, it is considered, to expand a diameter of an absorbing port of the vacuum nozzle or to increase the sucking force. If the diameter of the absorbing port and the sucking force are increased, however, such a problem arises that the component itself is sucked into the vacuum nozzle. Further, another problem is caused, wherein the vacuum nozzle sucks the solder and gets clogged.

Moreover, in the conventional dedicated rework apparatus, after the component has been removed from the substrate, the solder remaining on the substrate is leveled, and the solder therefore needs reheating after being hardened. In this case, there might be a possibility of exerting thermal damages on the solder land, the substrate and the peripheral components.

SUMMARY OF THE INVENTION

It is an object, which was devised in view of these problems, to provide a micro component removing method and a micro component removing device capable of surely removing a micro component and leveling solder remaining on a substrate without exerting any thermal damages on a solder land, the substrate and peripheral components.

Here is illustrated to solve the problems.

A method of removing a micro component soldered to a substrate from the substrate. The method comprising:

applying a thermosetting adhesive over a surface, on the opposite side to the substrate, of the micro component;

abutting a tip of a component holding pin against the surface of the micro component via the thermosetting adhesive;

fixing the component holding pin to the micro component in a way that hardens the thermosetting adhesive by heating the thermosetting adhesive;

melting solder by heating the solder between the micro component and the substrate; and removing the micro component from the substrate by moving the component holding pin in such a direction as to get distanced from the substrate.

Accordingly, the component holding pin is fixed to the micro component by the thermosetting adhesive, and, after melting the solder between the micro component and the substrate, the micro component is removed from the substrate by moving the component holding pin in such a direction as to get distanced from the substrate.

Accordingly, even if the micro component is mounted with a skew on the substrate, the micro component can be surely fixed to the component holding pin. This enables the micro component to be steadily removed.

The micro component removing method may further include:

embedding, after the solder has been melted, a solder leveling pin into the solder;

removing part of the solder adhered to the solder leveling pin by moving the solder leveling pin in such a direction as to get distanced from the substrate in a melted state of the solder; and continuously heating, after adhering part of the solder to the solder leveling pin and removing the solder, the solder remaining on the substrate.

In this case, simultaneously with removal of the micro component, the solder can be leveled by continuously heating the solder remaining on the substrate. Consequently, after the solder remaining on the substrate has been cooled and thus hardened, there is no necessity for re-heating this residual solder for leveling, and it is therefore feasible to prevent thermal damages from being exerted on a solder land, components disposed along the periphery of the removed micro component and the substrate.

Still further, a micro component removing apparatus for removing a micro component soldered to a substrate is illustrated. The apparatus comprising:

a component holding pin having a predetermined sectional area;

a pin up-down driving member moving the component holding pin in such directions as to get close to and get distanced from the substrate; and a heating member heating a thermosetting adhesive provided on a surface of the micro component and heating the solder between the micro component and the substrate.

It is preferable that the heating member includes a soft beam generating portion. In this case, the thermal damages can be prevented from being exerted on the components peripheral to the should-be-removed micro component and on the substrate. White light beams can be exemplified as the soft beams.

It is desirable that the pin up-down driving member includes solder leveling pins disposed on both sides of the component holding pin, capable of abutting on lumps of solder exposed on both sides of the micro component, and elastically biased toward the substrate.

In this case, the solder leveling pins descend integrally with the component holding pin and abut on the lumps of solder before the lumps of solder are melted. In this state, when the solder is melted, the solder leveling pin is embedded into the solder by dint of elastic biasing force toward the substrate.

It is desirable that the predetermined sectional area of the component holding pin is encompassed within the surface of the micro component.

In this case, even if an interval between the micro components on the substrate is narrow, when the component holding pin descends, the component holding pin can be prevented from being brought into contact with another micro component neighboring to the should-be-removed micro component.

As explained above, the component holding pin is fixed to the micro component by the thermosetting adhesive, and the micro component is removed by raising the component holding pin.

Accordingly, even if the micro component is mounted with the skew on the substrate, the component holding pin can be surely fixed to the micro component, and hence the micro component can be steadily removed.

Moreover, the solder leveling pins are provided on both sides of the component holding pin, after removing the micro component, in the case of continuously heating the solder, the solder remaining on the substrate can be leveled immediately after the micro component has been removed.

Accordingly, after the solder has been cooled and thus hardened, there is no necessity for re-heating in order to level the solder, and it is therefore possible to prevent the thermal damages from being exerted on the solder land, the components peripheral to the should-be-removed micro component and the substrate.

DETAILED DESCRIPTION OF THE INVENTION

Such an object is realized that micro components can be surely removed from a substrate, solder remaining on the substrate is leveled without exerting any thermal damages to a solder land, peripheral components to the should-be-removed micro components and the substrate.

Detailed descriptions of a micro component removing method and a micro component removing device will hereinafter be made with reference to the drawings.

Figure 1:
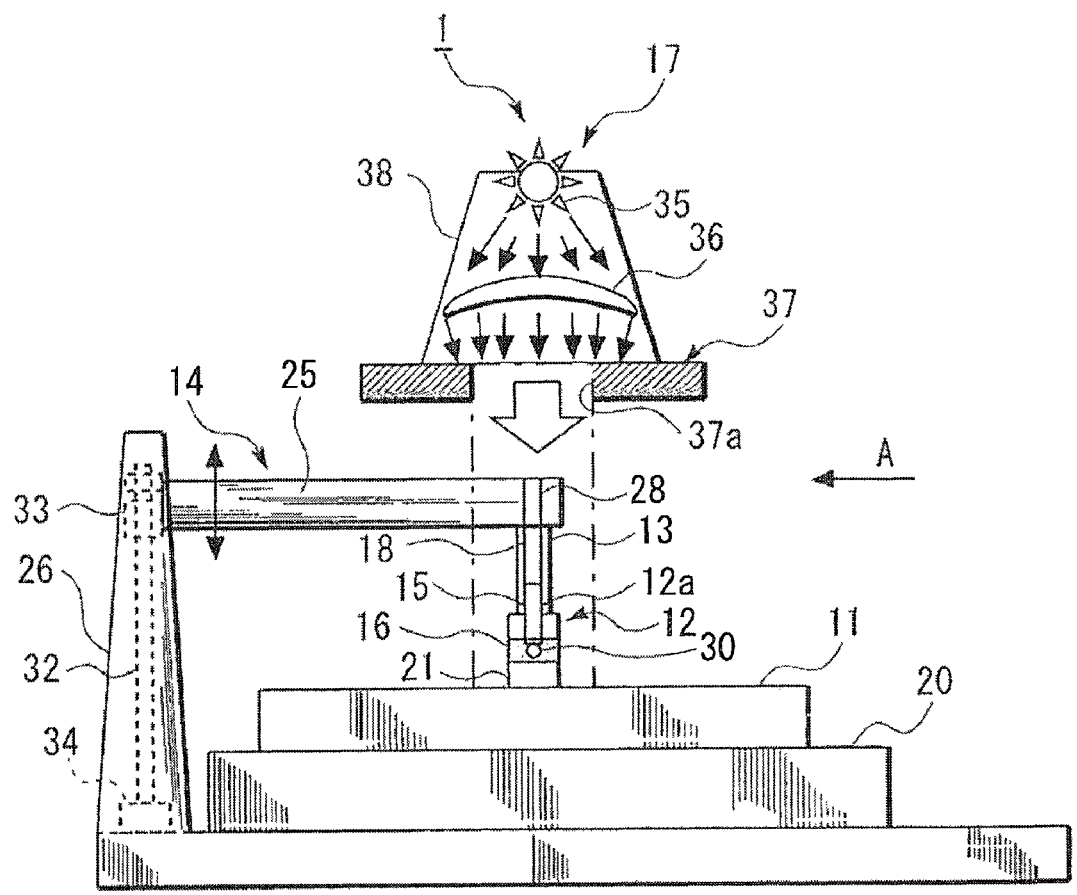
FIG. 1 is a view illustrating a micro component removing apparatus according to the present invention.

FIG. 1 illustrates a micro component removing apparatus 1. The micro component removing apparatus 1 is an apparatus that removes a micro component 12 soldered onto a substrate 11 from the substrate 11.

The micro component removing apparatus 1 includes a component holding pin 13 having a predetermined sectional area, a pin up-down driving member 14 that moves the component holding pin 13 in such directions as to get close to and get distanced from the substrate 11, a thermosetting adhesive 15 provided on a surface 12a of the micro component 12, and a heating member 17 that heats a solder 16 between the micro component 12 and the substrate 11 at a predetermined temperature.

In the first embodiment, the sectional area of the component holding pin 13 is a size encompassed within the surface 12a, on the opposite side to the substrate 11, of the micro component 12.

Figure 2:
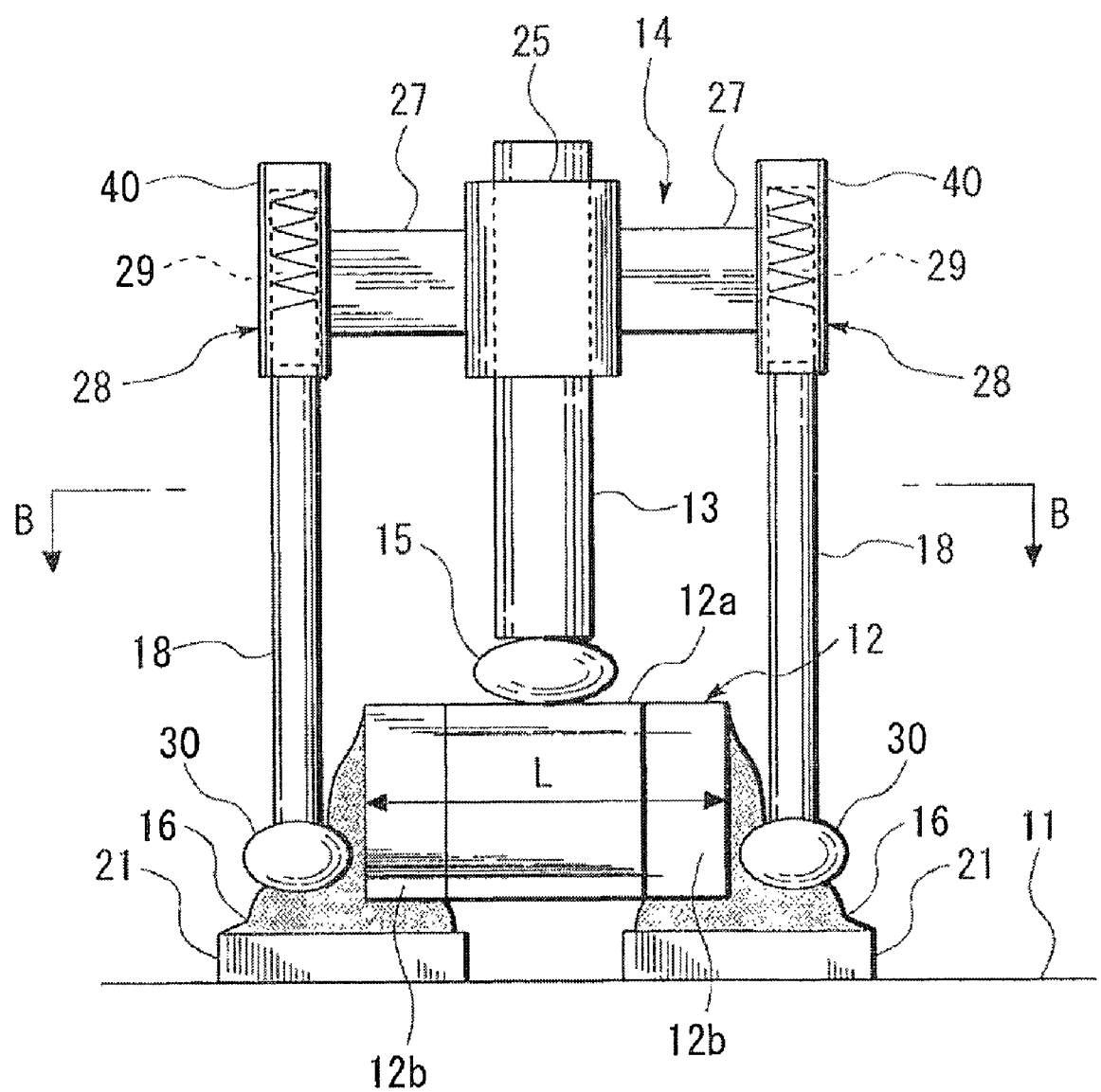
FIG. 2 is a view taken along an arrow A in FIG. 1, showing a component holding pin and solder leveling pins according to the present invention.

Further, the micro component removing apparatus 1 has solder leveling pins 18 provided at the pin up-down driving member 14. The solder leveling pins 18 are, as illustrated in FIG. 2, disposed on both sides of the component holding pin 13 and can abut on the solders 16 exposed on both sides of the micro component 12. Further, the solder leveling pins 18 are elastically biased toward the substrate 11 by elastic biasing members 28 that will be described later on.

Note that a numeral 20 in FIG. 1 stands for an X-Y stage that moves the substrate 11 in X-Y directions within a horizontal plane, and the numeral 21 represents a solder land (conductor pattern) provided on the substrate 11.

Next, the respective components will be explained. Note that the components other than those described below can involve using general types of components, and hence their detailed explanations are omitted.

The micro component 12 can be exemplified by an angular chip that is equal to or smaller than 1 mm on one side and is equal to or smaller than 0.5 mm on the other side. Thus, it is difficult for an operator to manually remove the extremely small micro component 12 from the substrate 11 by use of a soldering iron.

Figure 3:
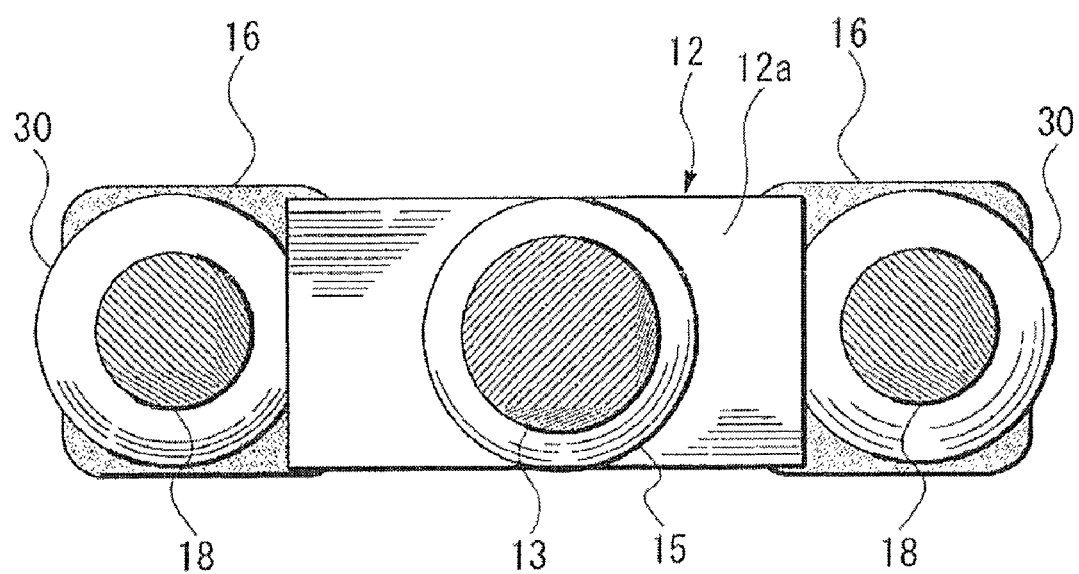
FIG. 3 is a sectional view taken along the line B-B in FIG. 2, showing a relation between the component holding pin and the micro component according to the present invention, and a relation between the solder leveling pin and solder.

The component holding pin 13 is formed in a bar shape. Further, as shown in FIG. 3, the component holding pin 13 is formed in a circular shape in section. A sectional area of the component holding pin 13 has a size encompassed within the surface 12a of the micro component 12.

In the first embodiment, the solder leveling pin 18 takes a bar shape similarly to that of the component holding pin 13. Further, the section of the solder leveling pin 18 is formed in a circular shape. Still further, a sectional area of the solder leveling pin 18 has a size encompassed within the surface 12a of the micro component 12.

The pin up-down driving member 14 includes, as illustrated in FIG. 1, a horizontal arm 25 having a proper length and a moving portion 26 that moves the horizontal arm 25 up and down.

The horizontal arm 25 is, as illustrated in FIG. 2, an elongate member taking a square shape in section. A leading end of the horizontal arm 25 is fitted with the component holding pin 13 in a way that makes up-down directional positions adjustable.

Moreover, the leading end of the horizontal arm 25 is provided with sub-arms 27, 27 extending on both sides. The solder leveling pins 18, 18 are provided at leading ends of these sub-arms 27, 27 via the elastic biasing members 28.

The elastic biasing member 28 includes a bottomed cylindrical member 40 and a compression coil spring 29 provided within the cylindrical member 40. An upper end of the solder leveling pin 18 is inserted into the cylindrical member 40. Then, the solder leveling pin 18 is biased by the compression coil spring 29 toward the substrate 11.

Moreover, an interval between the cylindrical member 40, 40 in the elastic biasing members 28, 28 on both sides is slightly larger than an external interval L between terminal portions 12b, 12b of the micro component 12. With this contrivance, the solder leveling pins 18, 18 provided at the elastic biasing members 28, 28 can abut on the lumps of solder 16, 16 exposed sideways of the micro component 12.

Note that before the solder leveling pins 18, 18 abut on the lumps of solder 16, 16, a post flux 30 is applied over the leading ends of the solder leveling pins 18, 18. The post flux 30 has a property harmonizing with the solder 16.

As shown in FIG. 1, the moving portion 26 of the pin up-down driving member 14 has a screw member 32 and a nut member 33 screwed to the screw member 32. The horizontal arm 25 is secured to the nut member 33. Further, a motor 34 capable of making forward and reverse rotations is connected to the screw member 32.

When the motor 34 rotates, the screw member 32 is rotated. With this operation, the nut member 33 slidably moves on the screw member 32, while the horizontal arm 25, the component holding pin 13 and the solder leveling pins 18, 18 move upward or downward.

The heating member 17 includes, as illustrated in FIG. 1, a soft beam generating portion 35, a diaphragm lens 36, a mask member 37 and a cover member 38.

The soft beam generating portion 35 emits white light beams. The soft beam generating portion 35 can be exemplified by, e.g., a halogen lamp. The diaphragm lens 36 can be exemplified by a convex lens. The diaphragm lens 36 converges the beams generated by the soft beam generating portion 35. The soft beams are easier in terms of controlling a heating temperature and a period of heating time than by laser beams.

The mask member 37 includes a hole 37a having a predetermined size. The soft beams converged by the diaphragm lens 36 irradiate only a predetermined range via a hole 37a. The hole 37a has a size equivalent to a range embracing the should-be-removed micro component 12 and the solders 16 exposed sideways of the micro component 12. Further, the hole 37a is formed in such a shape and a size that the components, other than the predetermined range, peripheral to the should-be-removed micro component 12 are not irradiated with the soft beams.

The heating member 17 can adjust a focal length of the soft beams by adjusting a distance between the soft beam generating portion 35 and the diaphragm lens 36 and a distance between the diaphragm lens 36 and the mask member 37.

Figure 4:
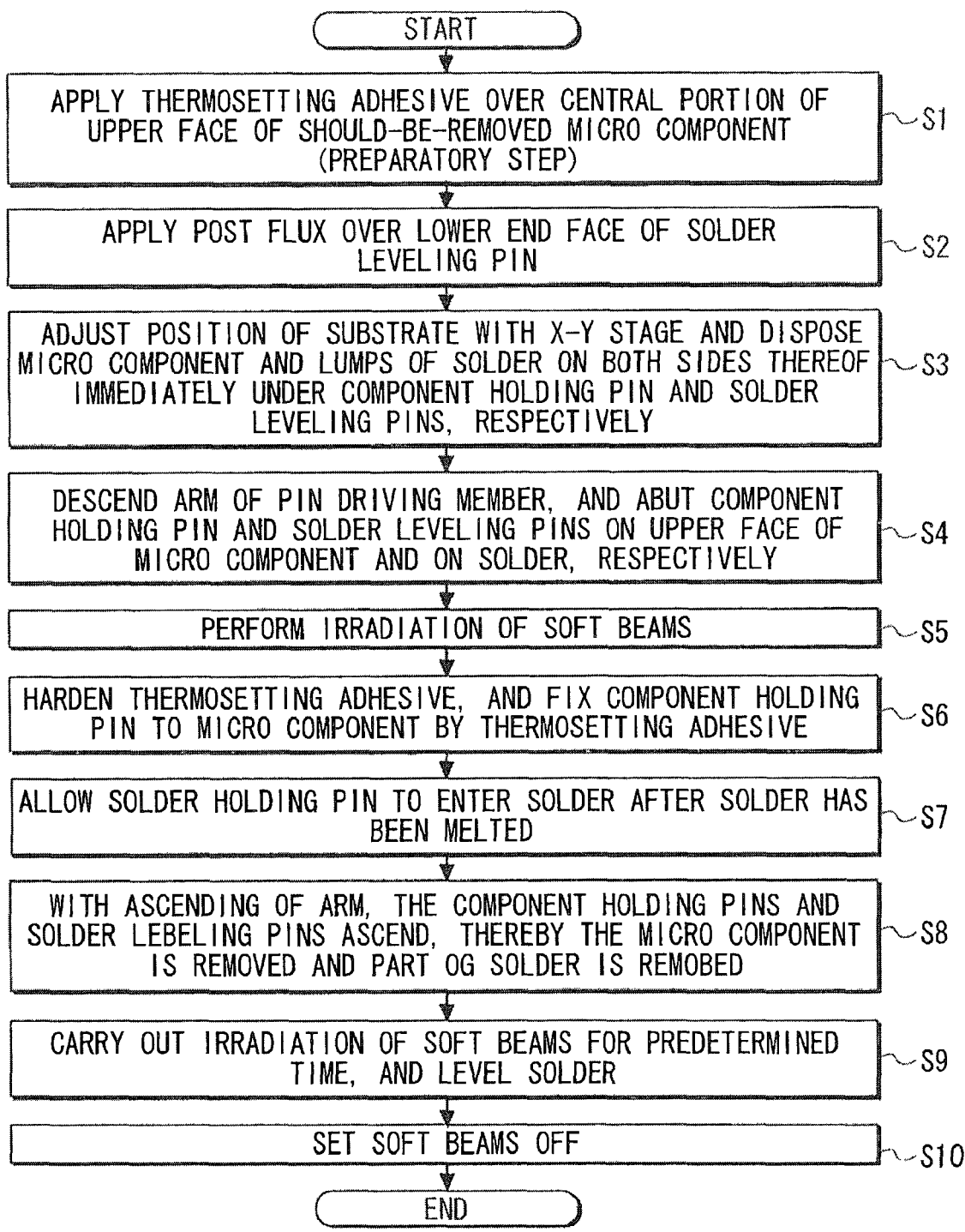
FIG. 4 is a flowchart showing a micro component removing method according to the present invention.

Next, a method, by which the micro component removing apparatus 1 removes the micro component 12 mounted on the substrate 11, will be described with reference to FIG. 4.

To begin with, a preparatory step is that before the should-be-removed micro component 12 is disposed immediately under the component holding pin 13, a proper quantity of thermosetting adhesive 15 is applied over the upper face (surface) 12a of the micro component 12 (S1). Here at, the thermosetting adhesive 15 still remains softened.

Next, the post flux 30 is applied to lower end faces of the solder leveling pins 18, 18 (S2). At this time, the component holding pin 13 and the solder leveling pins 18, 18 are disposed in ascending limit positions.

Next, an X-Y directional position of the substrate 11 is adjusted by the X-Y stage 20. With this adjustment, the micro component 12 is disposed just under the component holding pin 13. The lumps of solder 16, 16 extruding sideways from the terminal portions 12b, 12b of the micro component 12 are disposed directly under the solder leveling pins 18, 18 (S3).

Next, the horizontal arm 25 of the pin up-down driving member 14 is descended. Then, the component holding pin 13 fitted to the horizontal arm 25 and the solder leveling pins 18, 18 abut on the surface 12a of the micro component 12 and on the lumps of solder 16, 16, respectively (S4).

Subsequently, the soft beam generating portion 35 of the heating member 17 emits the soft beams. The soft beams travel through the diaphragm lens 36 and the hole 37a of the mask member 37, and irradiate the predetermined range embracing the target micro component 12, the thermosetting adhesive 15 and the lumps of solder 16, 16 exposed sideways from the target micro component 12 (S5).

When the thermosetting adhesive 15 is irradiated with the soft beams for a predetermined period of time, the thermosetting adhesive 15 gets hardened. The component holding pin 13 is thereby fixed to the micro component 12 (S6).

Further, the solder 16 is irradiated with the soft beams for a predetermined period of time and is thereby melted. Then, the solder leveling pin 18 elastically biased toward the solder 16 by the compression coil spring 29 moves toward the substrate 11 and is embedded into the melted solder 16 (S7).

At this time, the melted solder 16 is harmonized with the post flux 30 applied to the solder leveling pin 18 and is thus adhered to the solder leveling pin 18.

Next, the horizontal arm 25 of the pin up-down driving member 14 ascends, and the solder leveling pins 18, 18 are moved in such a direction as to get distanced from the substrate 11 (S8).

With this operation, ascending force acts on the micro component 12 fixed to the component holding pin 13. At this time, the lumps of solder 16, 16 between the micro component 12 and the substrate 11 have already melted, and hence, with the ascendance of the component holding pin 13, the micro component 12 is removed from the substrate 11.

Further, some of the lumps of solder 16, 16 adhered to the solder leveling pin 18 are removed by dint of the ascendance of the solder leveling pin 18.

Thus, simultaneously with the removal of the micro component 12 from the substrate 11, some of the lumps of solder 16, 16 are removed from on a solder land 21, and thereafter the irradiation of the soft beams continues for a predetermined period of time, e.g., for several seconds (S9).

With this operation, the lumps of solder 16, 16 remaining on the solder land 21 retain their melted state for the predetermined period of time. Further, a part of the post flux 30 applied to the solder leveling pin 18 is transferred onto the solder 16.

Then, the melted solder 16 is harmonized with the post flux 30, thereby decreasing a depth of ruggedness formed when removing part of the solder 16. The solder 16 is thereby leveled in a semicylindrical shape.

After the irradiation of the soft beams for the predetermined period of time, the emission of the soft beams is stopped (S10).

Thus, in the micro component removing apparatus 1 and the micro component removing method, the component holding pin 13 having the predetermined sectional area is fixed to the micro component 12 by the thermosetting adhesive 15.

Then, after the lumps of solder 16, 16 between the micro component 12 and the substrate 11 have been heated and melted by the soft beams, the component holding pin 13 ascends. The micro component 12 is thereby removed from the substrate 11.

Accordingly, even when the micro component 12 is mounted with a skew on the substrate 11, the component holding pin 13 can be surely fixed to the micro component 12, and hence the micro component 12 can be certainly removed.

Moreover, simultaneously with the removal of the micro component 12, part of the solder 16 is removed by the solder leveling pin 18. Thereafter, the solder 16 remaining on the solder land 21 continues to be heated for the predetermined period of time by the soft beams. The solder 16 is thereby leveled.

Namely, in continuation with the removal of the micro component 12, the solder 16 remaining on the substrate 11 is leveled.

This operation, for leveling the solder 16 remaining on the solder land 21, eliminates a necessity for heating again the solder 16 after the solder 16 has been cooled and then hardened.

It is therefore feasible to prevent the thermal damages from being exerted on the solder land 21, the components disposed along the periphery of the removed micro component 12 and the substrate 11.

Further, the predetermined range embracing the thermosetting adhesive 15 and the lumps of solder 16, 16 is irradiated spotwise with the soft beams. Accordingly, it is possible to prevent the components peripheral to the should-be-removed micro component 12 from being excessively overheated and to therefore prevent the thermal damages from being exerted on these components.

Moreover, the lumps of solder 16, 16 between the components peripheral to the should-be-removed micro component 12 and the substrate 11 can be prevented from being melted again, and hence the reliability of the substrate 11 can be prevented from declining.

Furthermore, the solder 16 is heated by the soft beams and can be therefore surely melted even when employing the solder exhibiting a high melting temperature as in the case of a lead-free solder.

Moreover, the components peripheral to the lumps of solder 16, 16 can be prevented from being excessively overheated because of using the soft beams that are easy to control the heating temperature and the heating time in order to heat the lumps of solder 16, 16. The thermal damages can be thereby prevented from being exerted on the components peripheral to the lumps of solder 16, 16.

Note that when using the laser beams in place of the soft beams, the heating temperature and the heating time are difficult to be controlled, and there might be a possibility that the components peripheral to the lumps of solder 16, 16 are excessively heated. It is therefore not preferable that the laser beams are employed.

Moreover, the component holding pin 13 and the solder leveling pin 18 each takes a bar-like shape, and their sectional areas have sizes each encompassed within the surface 12a, on the opposite side to the substrate 11, of the micro component 12.

With this contrivance, it is possible to prevent, when the component holding pin 13 and the solder leveling pin 18 descend toward the substrate 11, the component holding pin 13 and the solder leveling pin 18 from interfering with the components peripheral to the target micro component 12.

Accordingly, the micro component 12 can be removed without being restricted by a component-to-component interval.

Note that in the first embodiment, the heating member involves using the soft beam generating portion 35 and can involve employing a heater etc.

INDUSTRIAL APPLICABILITY

The present invention can be applied to reworking the substrate in the variety of information processing apparatus such as the computer.

What is claimed is:

1. An apparatus for removing a micro component soldered to a substrate, comprising:
   a component holding pin having a predetermined sectional area;
   a pin up-down driving member moving the component holding pin in such directions as to get close to and get distanced from the substrate;
   a heating member heating a thermosetting adhesive provided on a surface of the micro component and heating the solder between the micro component and the substrate,
   wherein the heating member includes a soft beam generating portion,
   wherein the pin up-down driving member includes solder leveling pins disposed on both sides of the component holding pin, capable of abutting on lumps of solder exposed on both sides of the micro component, and elastically biased toward the substrate.

2. The apparatus for removing a micro component according to claim 1, wherein the predetermined sectional area of the component holding pin is encompassed within the surface of the micro component.

3. The apparatus for removing a micro component according to claim 1, wherein the heating member spot-irradiates with soft beams and heats the thermosetting adhesive and the solder placed between the micro component and the substrate.

4. The apparatus for removing a micro component according to claim 1, wherein the heating member further includes a diaphragm lens, and a mask member, the heating member spot-irradiates with soft beams and heats the thermosetting adhesive and the solder placed between the micro component and the substrate.

* * * * *